United States Patent
David et al.

(10) Patent No.: US 10,490,696 B2
(45) Date of Patent: Nov. 26, 2019

(54) III-NITRIDE LED WITH TUNNEL JUNCTION

(71) Applicant: SORAA, INC., Freemont, CA (US)

(72) Inventors: Aurelien J. F. David, San Francisco, CA (US); Mark P. D'Evelyn, Freemont, CA (US); Christophe A. Hurni, Freemont, CA (US); Nathan Young, Freemont, CA (US); Michael J. Cich, Freemont, CA (US)

(73) Assignee: SORAA, INC., Fremont, CA (US)

( * ) Notice: Subject to any disclaimer, the term of this patent is extended or adjusted under 35 U.S.C. 154(b) by 0 days.

(21) Appl. No.: 15/674,077

(22) Filed: Aug. 10, 2017

(65) Prior Publication Data
US 2018/0047868 A1    Feb. 15, 2018

Related U.S. Application Data

(60) Provisional application No. 62/372,935, filed on Aug. 10, 2016.

(51) Int. Cl.
| | |
|---|---|
| *H01L 33/06* | (2010.01) |
| *H01L 33/00* | (2010.01) |
| *H01L 33/02* | (2010.01) |
| *H01L 33/08* | (2010.01) |
| *H01L 33/32* | (2010.01) |
| *H01L 33/04* | (2010.01) |
| *H01L 33/14* | (2010.01) |

(52) U.S. Cl.
CPC .......... *H01L 33/06* (2013.01); *H01L 33/007* (2013.01); *H01L 33/025* (2013.01); *H01L 33/04* (2013.01); *H01L 33/08* (2013.01); *H01L 33/32* (2013.01); *H01L 33/145* (2013.01)

(58) Field of Classification Search
CPC ... H01L 33/007; H01L 33/0075; H01L 33/04; H01L 33/06; H01L 33/025; H01L 33/32; H01L 33/08; H01L 33/145
See application file for complete search history.

(56) References Cited

U.S. PATENT DOCUMENTS

2017/0084779 A1 *    3/2017    Moe .................. H01L 33/06

OTHER PUBLICATIONS

Garcia, J., et al., "Epitaxially stacked GaAs/GaAlAs lasers using a low-resistance tunnel junction." Journ. Cryst. Growth 201, 891 (1999).
Grundmann, M., et al., "Multi-color light emitting diode using polarization-induced tunnel junctions." Phys. stat sol c 4, 2830 (2007).
Malinverni, M., et al., "InGaN based micro light emitting diodes featuring a buried GaN tunnel junction." Appl. Phys. Lett 107, 051107 (2015).

(Continued)

*Primary Examiner* — Laura M Menz
*Assistant Examiner* — Candice Chan
(74) *Attorney, Agent, or Firm* — FisherBroyles LLP

(57) ABSTRACT

A method of forming a III-Nitride based device comprising: (a) depositing first layers by MOCVD on a substrate, wherein the first layers comprise device layers of III-Nitride material; and (b) depositing epitaxial second layers over the first layers by at least one of sputtering, plasma deposition, pulsed laser deposition, or liquid phase epitaxy, wherein the second layers comprise III-Nitride material and define at least partially a tunnel junction.

11 Claims, 14 Drawing Sheets

(56) References Cited

OTHER PUBLICATIONS

Nakamura, E, et al., "Dramatic reduction in process temperature of InGaN-based light-emitting diodes by pulsed sputtering growth technique." Appl. Phys. Lett. 104, 051121 (2014).
Oseki, M., et al., "Field-effect transistors based on cubic indium nitride." Nat. Sci. Rep. 4, 3951 (2014).
Wantanabe, et al, "AlGaN/GaN heterostructure prepared on a Si (110) substrate via pulsed sputtering." Appl. Phys. Lett 104, 182111 (2014).
Young, E., et al, "Hybrid tunnel junction contacts to III—nitride light-emitting diodes." Appl. Phys. Expr. 9, 022102 (2016).
Van der Ziel, J.P., "Integrated Multilayer GaAs lasers separated by tunnel junctions", Appl. Phys. Lett. 41, 499 (1982).

\* cited by examiner

III-NITRIDE LED WITH TUNNEL JUNCTION

REFERENCE TO RELATED APPLICATION

This application is based on U.S. Provisional Application No. 62/372,935, filed Aug. 10, 2016, hereby incorporated by reference.

FIELD OF INVENTION

The invention relates generally to an optoelectric device having a tunnel junction, and, more specifically, to an optoelectric device, such as a light emitting diode LED, having a tunnel junction prepared using hybrid manufacturing techniques to optimize the device and overlaying epitaxial layers.

BACKGROUND

Prior art references recognize that tunnel junctions (TJs) can be useful in a variety of semiconductor devices, including GaN-based devices. Typically, standard GaN epitaxial growth ends with a p-contact; therefore, typical GaN TJs are p-to-n TJs.

However, actually forming a TJ on a GaN device can be challenging. In particular, the preferred method for GaN device epitaxy is metalorganic chemical vapor deposition (MOCVD). However, MOCVD may not be ideally suited for GaN-based TJs. P-GaN grown by MOCVD is typically unactivated due to the presence of hydrogen during the growth, and needs an activation step. However, it is known that this activation is typically difficult or impossible when the p-layer is covered by an n-layer, as is the embodiment in a TJ, because it is difficult for hydrogen (which causes compensation in as-MOCVD-grown Mg-doped GaN) to out-diffuse through n-type GaN. Further, the high doping levels which are desirable for TJs (such as 1E20 or above) are difficult to achieve in MOCVD due to the existence of compensating defects (such as Si complexes or Mg complexes in n-type and p-type GaN, respectively).

On the other hand, TJs are more readily achieved in GaN grown by molecular beam epitaxy (MBE). Growth can occur in a hydrogen-free ambient, so that p-GaN is activated as-grown. Growth can occur far from thermodynamic equilibrium, thus enabling high doping levels without the formation of compensating defects found in MOCVD.

Grundmann, M., et al., "Multi-color light emitting diode using polarization-induced tunnel junctions." Phys. stat sol c 4, 2830 (2007) Malinverni, M., et al., "InGaN based micro light emitting diodes featuring a buried GaN tunnel junction." Appl. Phys. Lett 107, 051107 (2015) demonstrated an MBE-grown III-Nitride TJ, using polarization fields to help injection. demonstrated an MBE-grown III-Nitride TJ, using straight n- and p-GaN.

Based on this, it has been proposed [Young, E., et al, "Hybrid tunnel junction contacts to III-nitride light-emitting diodes." Appl. Phys. Expr. 9, 022102 (2016)] to combine MOCVD and MBE to grow a GaN device: in the embodiment of an LED, the active layers are grown by MOCVD (yielding high efficiency) and the TJ is grown by MBE (either fully or in part). This leads to good device performance. However, MBE machines are expensive, difficult to scale to large wafer diameters and throughputs, and not always robust, and thus may not be well suited for industrial implementation.

What is needed is a method to grow a high-quality hybrid GaN TJ with a second growth method which is inexpensive, readily scalable to large wafer diameters and throughputs, and robust. The present invention fulfills this need, among others.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Applicants have developed an approach for manufacturing a high-quality hybrid GaN tunnel junction (TJ), which is inexpensive, robust, and readily scalable to large wafer diameters and throughputs. In particular, Applicants recognize that by combining high-quality crystal growth techniques such as MOCVD with economical, wafer scale techniques such as pulsed sputtering and radio-frequency (RF) sputtering, an optoelectric device with a TJ can be produced with optimized device layers and overlaying epitaxial layers.

By way of background, sputtering has been investigated as a means to grow III-Nitride layers and films. Typically, sputtering is very inexpensive and can deposit very large amounts of materials on large-area substrates; however the material quality is not very well controlled (since this is typically not a high-vacuum process). Therefore, a large amount of impurities can be present, and sputtered material may be amorphous or semi-amorphous, with low crystalline quality. Therefore, it is commonly thought that sputtering is only suitable for lower-quality devices on cheap substrates, where device efficiency is not crucial. For instance, Ref. 4, Nakamura, E., et al., "Dramatic reduction in process temperature of InGaN-based light-emitting diodes by pulsed sputtering growth technique." Appl. Phys. Lett. 104, 051121 (2014) discusses GaN—InGaN LEDs grown by sputtering with a limited internal quantum efficiency of 24%, and concludes that the technique is suitable for growth on cheap, large-area glass substrates. Oseki, M., et al., "Field-effect transistors based on cubic indium nitride." Nat. Sci. Rep. 4, 3951 (2014) shows that it is possible to grow cubic InN by sputtering, thus indicating that a wide range of In contents are feasible; however this is only discussed in the context of low-cost transistor devices on special substrates. Wantanabe, et al, "AlGaN/GaN heterostructure prepared on a Si (110) substrate via pulsed sputtering." Appl. Phys. Lett. 104, 182111 (2014) demonstrates that epitaxial sputtering growth of GaN on a Si substrate is possible (again in the context of low-cost electronic devices). These works, however, do not envision state-of-the-art optoelectronic devices using sputtering.

However, Applicants have determined that it is possible to use sputtering to form a high-quality TJ over a GaN-based device grown by MOCVD, especially for an optoelectronic device. The common expectation that sputtering is only suitable for low-grade devices stems from the assumption that sputtering is used for all layers in the device. In contrast, Applicants employ MOCVD for growing the high-quality layers which are crucial for device performance (for instance, the active region of an LED or laser diode, which should display a high quantum efficiency and wall-plug efficiency), and sputtering in subsequent steps to grow the TJ and, optionally, other layers such as an additional n-type layer and n-contact layer. In preferred embodiments, the sputtered material is epitaxial to the MOCVD-grown material. This distinguishes embodiments from standard sputtered structures, where the sputtered material may be amorphous or have low crystalline quality, which can be unacceptable for device performance.

Accordingly, in one embodiment, the invention relates to a method of forming a III-Nitride based device comprising: (a) depositing first layers by MOCVD on a substrate, wherein the first layers comprise device layers of III-Nitride material; and (b) depositing epitaxial second layers over the first layers by at least one of sputtering, plasma deposition, pulsed laser deposition, or liquid phase epitaxy, wherein the second layers comprise III-Nitride material and define at least partially a tunnel junction.

In another embodiment, the invention relates to a product made from the process above.

In yet another embodiment, the invention relates to a III-Nitride based device comprising: (a) a substrate; (b) first layers disposed on the substrate, wherein the first layers comprise device layers and III-Nitride material; and (c) epitaxial second layers over the first layers, wherein the second layers comprise III-Nitride material, the second layers defining at least a portion of a tunnel junction, wherein the first layers have a lower detect concentration than the second layers.

DETAILED DESCRIPTION

In one embodiment, the invention provides a III-Nitride optoelectronic device (including an LED, a laser diode or an electronic device) with a hybrid TJ, which features device layers grown by MOCVD and epitaxial TJ layers grown by sputtering. In a variety of embodiments, this is achieved by growing device layers in MOCVD, interrupting the growth, transferring the wafer or sample to the sputtering tool, and growing the TJ or part of the TJ by sputtering. In some embodiments, as will be discussed further, subsequent growth in MOCVD or stacks of MOCVD/sputtered layers are possible.

As used herein, "device layers" refer to layers in which an essential function of the device is performed—including a non-trivial carrier transport or light emission function. For instance, in the case of an LED, the device layers may be the light-emitting layers (also called active region), or more broadly a stack comprising the light-emitting layers and related layers (for instance: quantum wells or double heterostructures, barrier layers, electron blocking layers). In the case of a laser diode, the device layers may comprise the same layers as in an LED, and may further comprise other layers involved in optical confinement (such as low-index or high-index cladding/waveguide layers used to confine the optical mode). In the case of an electronic device, the device layers may be layers where an essential carrier-transport process occurs; this could be the drift region of a p-i-n diode (such as in a vertical diode), or a region where a 2-dimensional electron or hole gas resides (in an electronic device predicated on 2D carrier gas transport, such as a lateral FET), or a region where carrier tunneling occurs (such as in a tunneling transistor). One skilled in the art will appreciate that some of these device layers require high material quality and low defect density, and that growing them by MOCVD may therefore be desirable.

In this disclosure, Applicants generally discuss a second growth step is achieved by sputtering because it addresses the requirements of the invention. However, other alternative embodiments may also include alternative suitable growth techniques with similar properties as sputtering, including methods using a plasma deposition such as pulsed laser deposition, or a liquid phase epitaxy method. These methods are within the scope of the invention insofar as they are less expensive, more scalable, and more robust than MBE, and, under the proper conditions, may facilitate epitaxial growth.

In this disclosure, Applicants generally discuss structures having a tunnel junction formed by a combination of MOCVD and sputtering. However, in alternative embodiments, the teachings of this Application may pertain to structures other than a tunnel junction that can be manufactured by hybrid MOCVD/sputtering epitaxy techniques disclosed herein.

Epitaxial Structures

Figure 1:
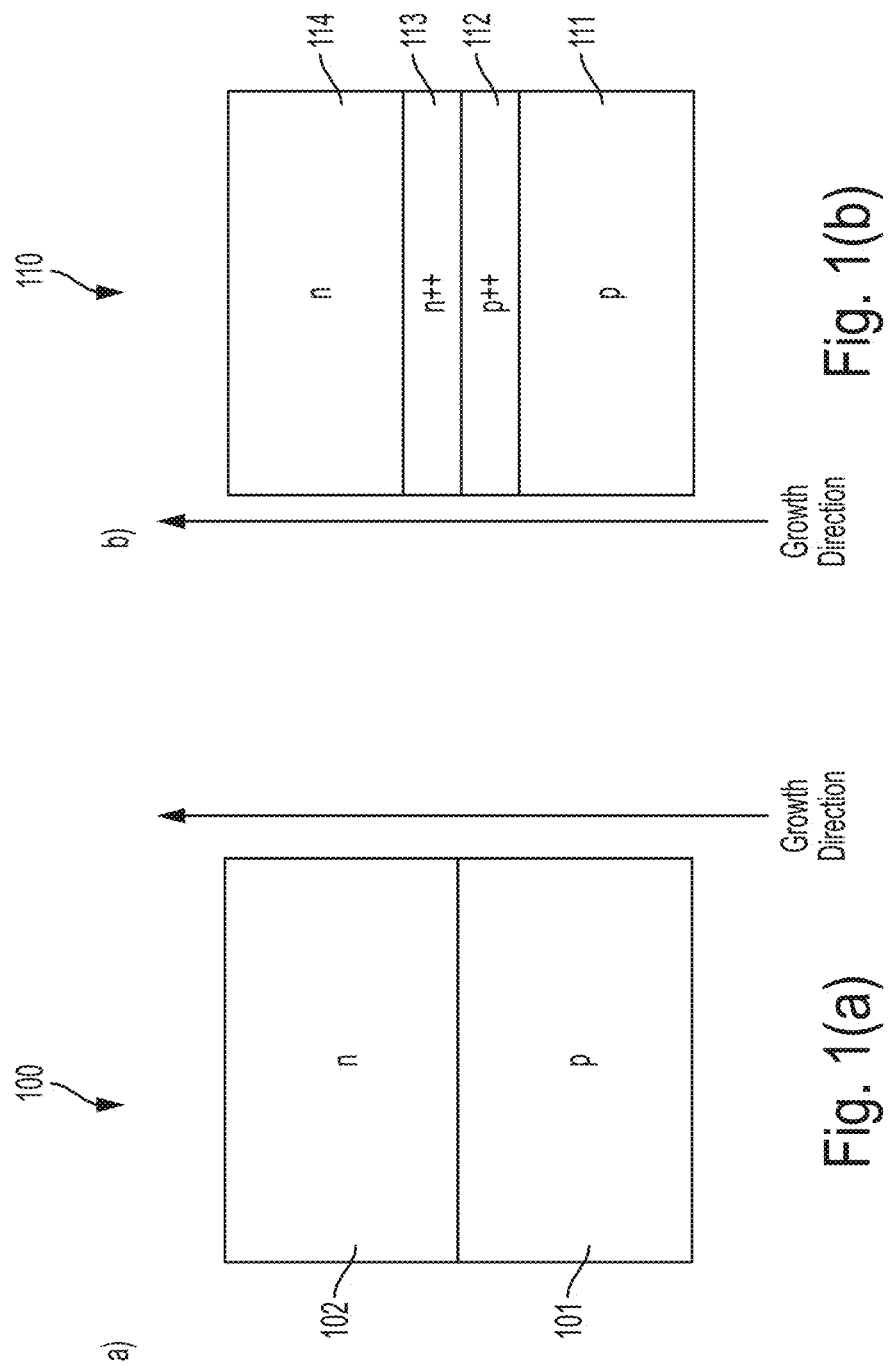
FIGS. 1a and 1b show simplified diagrams of possible GaN tunnel junction stacks.

FIGS. 1a and 1b show simplified sketches of possible GaN TJs. FIG. 1a shows a TJ 100 comprising a p-layer 101 followed by an n-layer 102. FIG. 1b shows a more detailed stack 110, having a p layer 111, a p++ layer 112 with high doping, an n++ layer 113 with high doping and an n layer 114. In general, additional layers of the device structure may be present underlying the layers shown in FIG. 1.

The n and p layers may have doping levels (in cm−3) of about 1E17, 5E17, 1E18, 5E18, 1E19, 2E19, 5E19, or doping levels in any range obtained by combining two of these values. The n++ and p++ layers may have doping levels (in cm−3) of about 1E19, 2E19, 5E19, 1E20, 2E20, 5E20, 1E21, or doping levels in any range obtained by combining two of these values. In the following structure description, Applicants do not always distinguish between p and p++ or between n and n++. Nevertheless, p may generally be understood to mean either p or p++ and n may be understood to mean either n or n++, because the difference is merely a doping level. For high doping levels (such as 1E19 and above, or 1E20 and above), the thickness of the corresponding layer may be limited to avoid material issues. For example, the thickness of a highly doped layer may be less than 10 nm, less than 5 nm, less than 3 nm, less than 2 nm, or less than 1 nm.

While FIG. 1 shows p-first and n-second in the TJ, it should be understood that the converse order (growing n first and then p) is also possible in any of the embodiments described. This may be of interest, for instance, for N-polar III-Nitrides.

Growth may occur on a variety of crystalline configurations, including wurtzite (along the c-direction in Ga or N polarity or along a non-polar a-plane or m-plane, or along a semipolar plane) and cubic.

Figure 2:
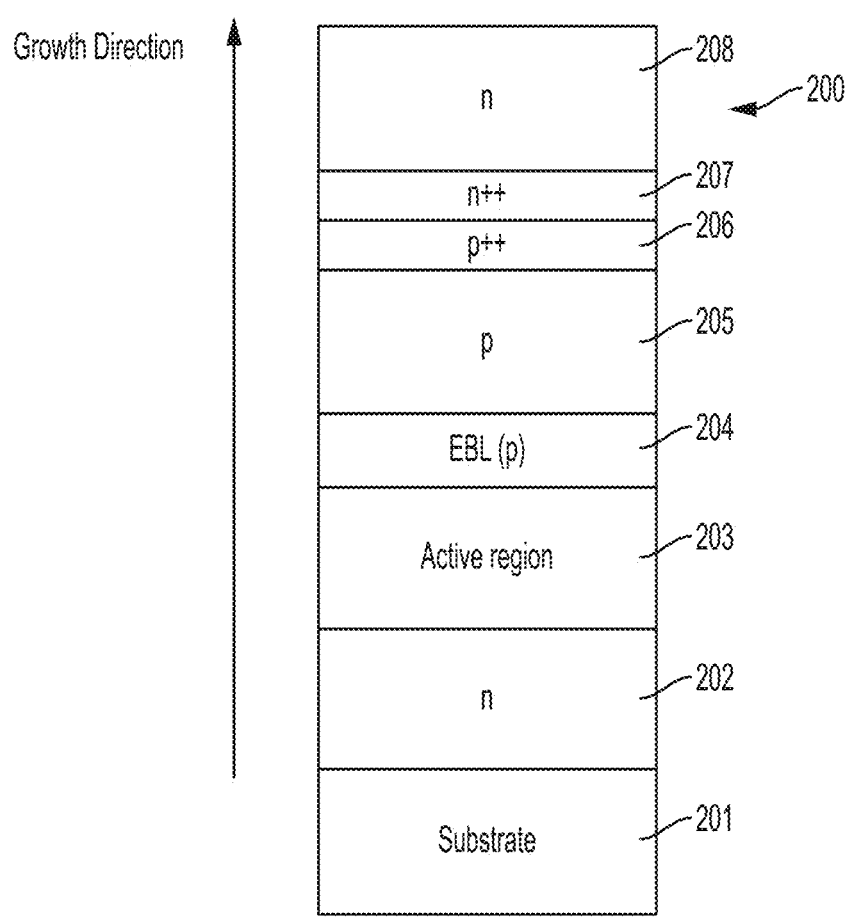
FIG. 2 shows a more complete structure having a tunnel junction, corresponding to an LED or a laser diode.

FIG. 2 shows a more complete structure 200, corresponding to an LED or a laser diode. The structure starts with an n layer 202 on a substrate 201, followed by an active region 203, an electron blocking layer 204 (EBL, for instance comprising an AlGaN or an AlInGaN layer, and often p-doped), p-layers 205 (p then p++) and n-layers 206 (n++ then n). The p++/n++ interface 207 defines the TJ.

The various layers forming the TJ comprise III-Nitride materials. They may be GaN, AlN, InN, or AlInGaN compounds.

Depending on the embodiment, various combinations of MOCVD and sputtering are possible. For instance, embodiments comprise the following:

MOCVD ends with p, sputtering starts with p++ then n++
MOCVD ends with p, sputtering starts with p then p++ then n++
MOCVD ends with p++, sputtering stars with n++
MOCVD ends earlier in the structure (for instance after the active region growth and before any p-doped layer is growth), sputtering growth includes p-layers and the whole TJ.

These various structures may present non-trivial respective advantages. For instance, some sputtering systems may be able to achieve much higher p doping levels than MOCVD without compensation. In such embodiments, sputtering the p++ layers may be preferred. In other embodiments, it may be preferable to grow the p layers by MOCVD and the n layers by sputtering to avoid Mg memory effects. In some embodiments, it may be desirable to use only one sputtering target which includes a high dopant concentration. In such embodiments, only the n++ layer is sputtered. In some embodiments, a very sharp TJ interface is sought; in such embodiments growing the p++ and n++ layers (i.e. the TJ interface) by sputtering may be preferred, since growth only occurs during sputtering. In some embodiments, it may be desirable to insert impurities at the TJ interface. In such embodiments, the p layers may be grown by MOCVD and the n layers by sputtering with an impurity-inducing step in between.

In general, referring to FIG. 2., the transition from MOCVD to sputtering may occur at any point above the active region. The transition may be at the start of a new layer, or even in the middle of one of the layers of FIG. 2. For instance, the MOCVD growth may be interrupted in the middle of the p layer and the sputtering growth may proceed with p-material with a similar or different doping density.

Even though FIG. 2 shows a few discrete layers, it is understood that more layers can be formed with various doping levels (for instance, the p layer may comprise sub-layers with varying doping levels and material compositions). Likewise, gradients in doping and composition are possible.

Figure 3:
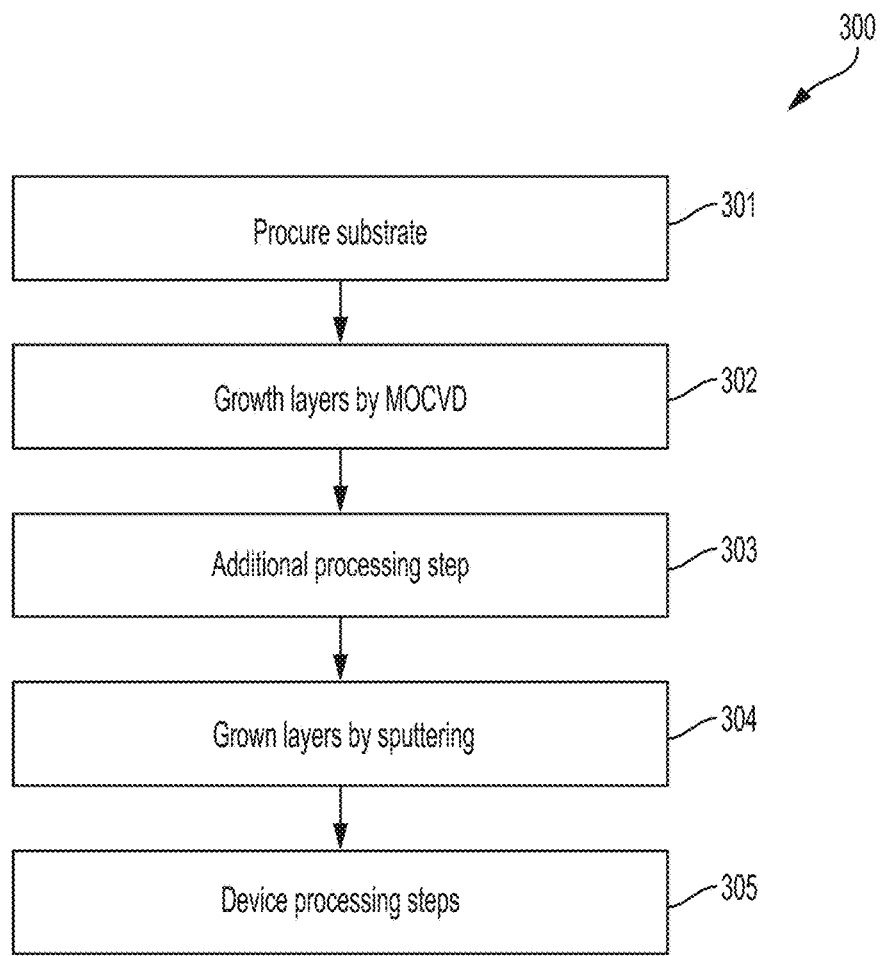
FIG. 3 shows the process steps of one embodiment of the present invention

FIG. 3 shows a process flow 300 for making embodiments of the invention. It comprises obtaining a substrate in step 301, MOCVD growth on a substrate in step 302 (which may be bulk GaN, sapphire, silicon, SiC, etc), followed by an optional processing step 303, followed by a sputtering growth in step 304, followed by final processing in step 305 to obtain the device (including forming electrical contacts, singulating devices, etc . . . ).

Figure 4:
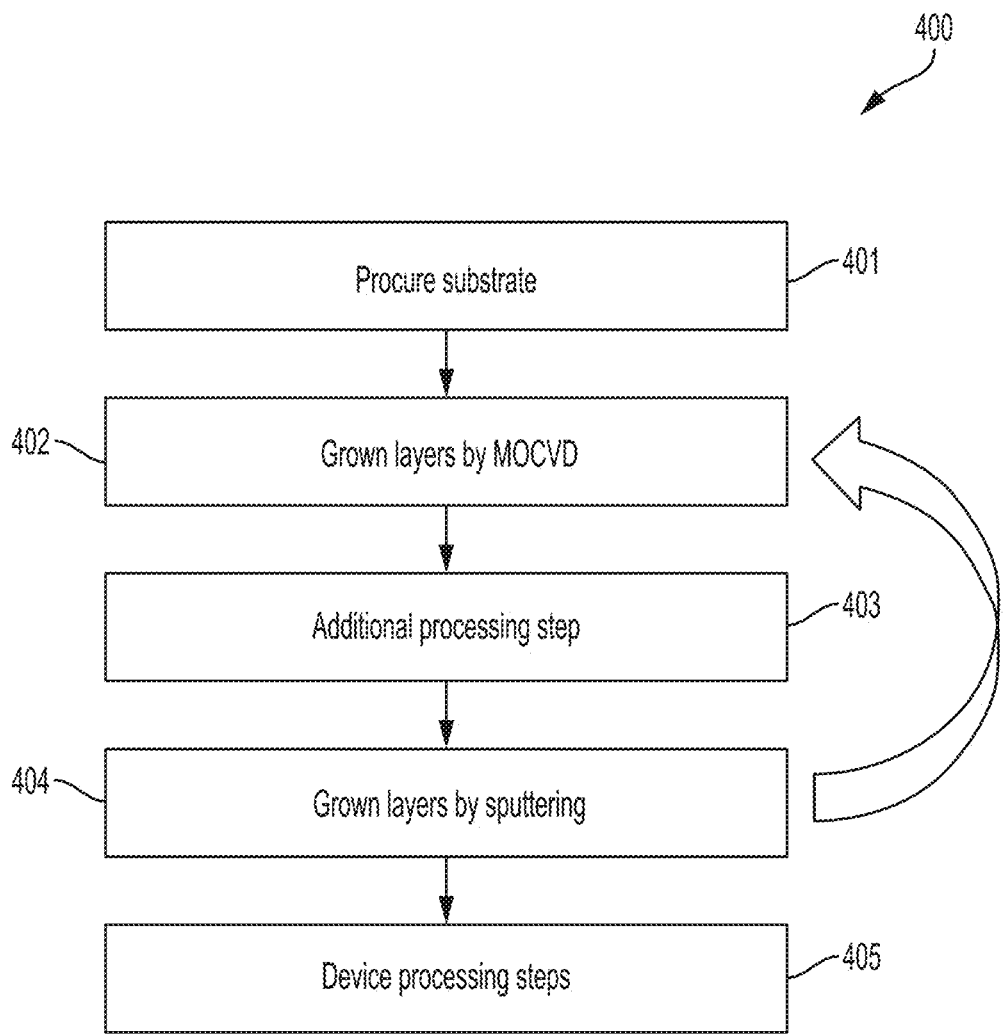
FIG. 4 shows another embodiment of the process steps of the present invention.

FIG. 4 shows an alternative flow 400 where the growth steps are repeated. For instance, the substrate is procured in step 401, growth by MOCVD in step 402, additional processing in step 303, sputtering in step 404, and then the MOCVD growth step 402 may be repeated. This process may be reiterated repeatedly. This enables the formation of more than one TJ. In some embodiments, the MOCVD steps correspond to the growths of multiple active regions. The concept of optoelectronic devices with multiple active regions separated by tunnel junctions was discussed in [Garcia99] and [vanderZiel182].

In a variety of embodiments, sputtering forms a coherent crystalline structure on top the underlying epitaxial material. In some embodiments, the quality of the sputtering material, as quantified, for example, by x-ray rocking-curve full-width-at-half-maximum (FWHM) measurements or by threading dislocation density (TDD) measurements, is inherited from and approximately equal to that of the underlying epitaxial material. For instance, coherent growth ensures that no new threading dislocations or stacking faults are created at the regrowth interface; or that the occurrence of such new defects is moderate enough to ensure high performance. For instance, the creation of new threading dislocations may occur with a threading dislocation density (TDD) of less than 1E4 cm−2, 1E5 cm−2, 1e6 cm−2, 1E7 cm−2, 1E8 cm−2, 1E9 cm−2, 1E10 cm−2.

In some embodiments, the MOCVD material is initially grown on a bulk GaN (or III-Nitride-containing) substrate, leading to high material quality and to a TDD of less than 1E7 cm−2, 3E6 cm−2, 1E6 cm−2, 3E5 cm−2, 1E5 cm−2, 3E4 cm−2, or 1E4 cm−2. In some embodiments, the same TDD is obtained after the sputtering regrowth. In some embodiments, the sputtering regrowth leads to a TDD which is substantially equal to that of the MOCVD material, or increases the MOCVD TDD by less than 2×, less than 5×, or less than 10×. In certain embodiments, the FWHM values of the lowest-order symmetric x-ray rocking curves of both the MOCVD material and of the sputtered material are less than about 500 arcsec, less than about 300 arcsec, less than about 200 arcsec, less than about 100 arcsec, less than about 75 arcsec, less than about 50 arcsec, or less than about 30 arcsec. These values may pertain to both on-axis and off-axis scans.

In a variety of embodiments, the sputtering parameters are configured such that coherent epitaxial growth is achieved. In some embodiments, the epitaxial coherence is achieved over a desired area, with boundaries where coherence may be lost. In some embodiments, various areas of crystal coherence are present and are separated by boundaries.

Epitaxial crystal coherence may be maintained on an area of 1 um2 or 100 um2 (i.e. corresponding to a square of 10 um by 10 um) or 1,000 um2 or 10,000 um2 or 100,000 um2 or 1,000,000 um2 (i.e. corresponding top a square of 1 mm by 1 mm) or 10,000,000 um2 or 100,000,000 um2 or over a whole wafer of diameter 2", 4", 6", 8", 10" or even larger areas. in some embodiments, crystal coherence is maintained over an area sufficient to form a device, such as an LED with a footprint of at least 100×100 um or 1×1 mm. In some embodiments, domains of crystal coherence may be separated or bound by crystal defects such as stacking faults and other registration defects.

In some embodiments, the crystal coherence is assessed by X-ray (XRD) diffraction. For instance, the full width at half maximum (FWHM) of an XRD rocking curve (in an omega scan) may be used to compare the crystalline quality of the underlying MOCVD III-Nitride material (for instance, GaN) and the sputtered III-Nitride material (for instance, GaN). In some embodiments, the two layers have substantially the same FWHM. In some embodiments, the sputtered GaN has a FWHM which is only moderately higher than the FWHM of the underlying GaN—for instance, only 1.1× or 1.5× or 2× or 5× or 10×. In some embodiments, the FWHM of the sputtered material is less than about 500 arcsec, less than about 300 arcsec, less than about 200 arcsec, less than about 100 arcsec, less than about 75 arcsec, less than about 50 arcsec, or less than about 30 arcsec.

In some embodiments, crystalline coherence is assessed by an XRD reciprocal space map (RSM). This may be useful if a material with a different composition is included in the TJ (for instance an InGaN layer in a GaN TJ). In some embodiments, the III-Nitride layers regrown by sputtering are substantially aligned with the underlying MOCVD layers in an RSM map, one or more RSM peaks associated with the sputtered layer coincides with the corresponding RSM peak associated with the MOCVD-grown layer. In certain embodiments, the corresponding RSM peaks for the MOCVD-grown and sputtered layers have substantially the same width. In a specific embodiment, at least one of the values of qx and qz for a particular RSM peak of the MOCVD-grown layer and of the sputtered layer lie within 0.005, 0.002, or 0.001 Å-1 of one another.

In other embodiments, the sputtered layers have a different equilibrium in-plane lattice constant than the underlying MOCVD layers, and the sputtered layers are partially or fully relaxed. In this embodiment, one or more peaks in an RSM map may not be aligned. Regardless, the sputtered layers may remain crystalline. For instance, the underlying MOCVD layers are substantially GaN-based and have an in-plane lattice constant of relaxed GaN. The sputtering layers are substantially InGaN-based (for instance with an In composition larger than 3% or 5% or 10% or 15% or 20%) and have partial or full relaxation, with an in-plane lattice constant of partially/fully relaxed InGaN.

In some embodiments, the materials are characterized by more than one in-plane lattice constant. The materials may be oriented along the c-plane, a non-polar plane (including m or a), a semipolar plane. They may be oriented along the gallium or the nitrogen face. Further, the III-Nitride material may be of wurtzite or cubic symmetry.

In some embodiments, a wide-angle XRD scan confirms the absence of other crystalline phases besides the phase of the underlying MOCVD material.

In some embodiments, crystalline coherence is assessed by transmission electron microscopy (TEM). TEM shows crystalline electronic diffraction at individual grains/positions in a sample. Therefore, the orientation of the MOCVD-grown material and sputtered material can be compared. In some embodiments, the orientation is identical for both materials across a TEM image which may have a lateral span of 10 nm, 100 nm, 1 um, 10 um, or 100 um.

In some embodiments, plan-view TEM or cathodoluminscence of the sputtered material demonstrates an absence of misfit dislocations, or a density of misfit dislocations below about 1E6, below about 1E5, below about 1E4, or below about 1E3 cm−1 in a plane perpendicular to the deposited surface layers. xxx.

In some embodiments, the surface roughness of the as-grown sputtered material is smooth, or is characterized by an RMS roughness less than 3 nm, less than 1 nm, less than 3A, less than 1A. In some embodiments, the RMS roughness is substantially equal to that of the underlying MOCVD RMS roughness. Such RMS roughnesses may be evaluated over an area of 1×1 um, 10×10 um, 100×100 um, and may be measured by atomic force microscopy. Further, embodiments may display a step-flow growth morphology, with a step height of one monolayer (ML), 2 ML, 3 ML, 4 ML, 5 ML, 6 ML, 7 ML, 8 ML, 9 ML, or 10 ML.

In some embodiments, at least one layer in the sputtered material is characterized by a material quality which is inferior to what would be obtained with conventional growth techniques for electronic or optoelectronic devices (i.e. MOCVD and MBE). Nevertheless, the sputtered material may remain epitaxial and provide a high-quality TJ, as described elsewhere in this Application. Material quality in this context is quantified by "defect concentration," which, in this context, is used generally to refer to extrinsic defects (also known as impurities, which may be atomic or molecular) as well as intrinsic crystal defects (including vacancy, interstitial, substitutionals, and crystal defects such as threading dislocations, stacking faults, misfit dislocations).

In some embodiments, at least one layer in the sputtered material comprises a high concentration of an extrinsic defect (or impurity). The impurity may be a chemical element such as O, C, H, a metal, a transition metal, an impurity contained in the sputtering tool (including the chamber, a material target, gases, etc). The impurity may be present at a concentration higher than 1E16 cm−3, 5E16 cm−3, 1E17 cm−3, 5E17 cm−3, 1E18 cm−3, 5E18 cm−3, 1E19 cm−3, This concentration may be characterized by SIMS, Auger, RBS, XPS, and other techniques known in the art. Defect concentrations for the same defects in an MOCVD layer may be substantially lower (such as half or a tenth of the concentration found in the sputtering layer).

In some embodiments, at least one layer in the sputtered material comprises a high concentration of an intrinsic defect, such as a vacancy (including Ga or N vacancy), interstitial, complex, stacking fault, threading dislocation, misfit dislocation. The defect concentration may be higher than 1E14 cm−3, 5E141 cm−3, 1E15 cm−3, 5E15 cm−3, 1E16 cm−3, 5E16 cm−3, 1E17 cm−3, 5E17 cm−3, 1E18 cm−3. This may be characterized by DLOS, DLTS, temperature-dependent Hall measurements, positron annihilation spectroscopy, and other techniques known in the art. Defect concentrations for the same defects in an MOCVD layer may be substantially lower (such as half or a tenth of the concentration found in the sputtering layer).

In some embodiments, a specific defect (extrinsic or intrinsic) has a concentration in at least one sputtered layer which is up to 2 times, 5 times, or 10 times its concentration in at least one MOCVD layer underlying the sputtered layer. In some embodiments, such defect concentrations are determined over a particular thickness of material, for instance at least 10 nm, 20 nm, 50 nm, or 100 nm, and may be average compositions across such a thickness. Unless otherwise specified, the defect concentration is averaged over a 20 nm thickness. In some embodiments, the MOCVD layer is the last MOCVD layer at the MOCVD/sputter interface, and the sputtered layer is the first layer at that interface. For instance, the MOCVD growth is terminated with an MOCVD layer where the oxygen concentration, averaged over a 20-nm thickness, is below 5E16 cm−3 and the first sputtering layer grown on this MOCVD layer has an oxygen concentration, averaged over a 20-nm thickness, of at least 1E17 cm−3. Or, the MOCVD growth is terminated in an MOCVD layer in which a defect (i.e., vacancy) concentration, averaged over a 20-nm thickness, is below 1E14 cm−3, and the first sputtering layer grown on this MOCVD layer has a vacancy concentration, averaged over a 20-nm thickness, of at least 5E14 cm−3.

Figure 5:
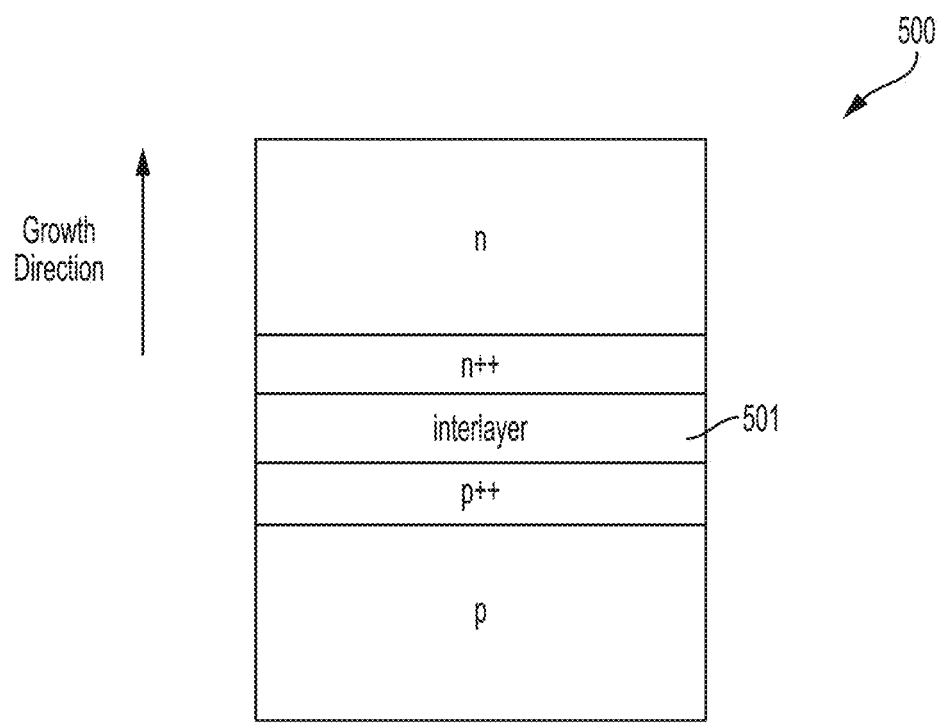
FIGS. 5-10 show alternative embodiments of the present invention.
Figure 6:
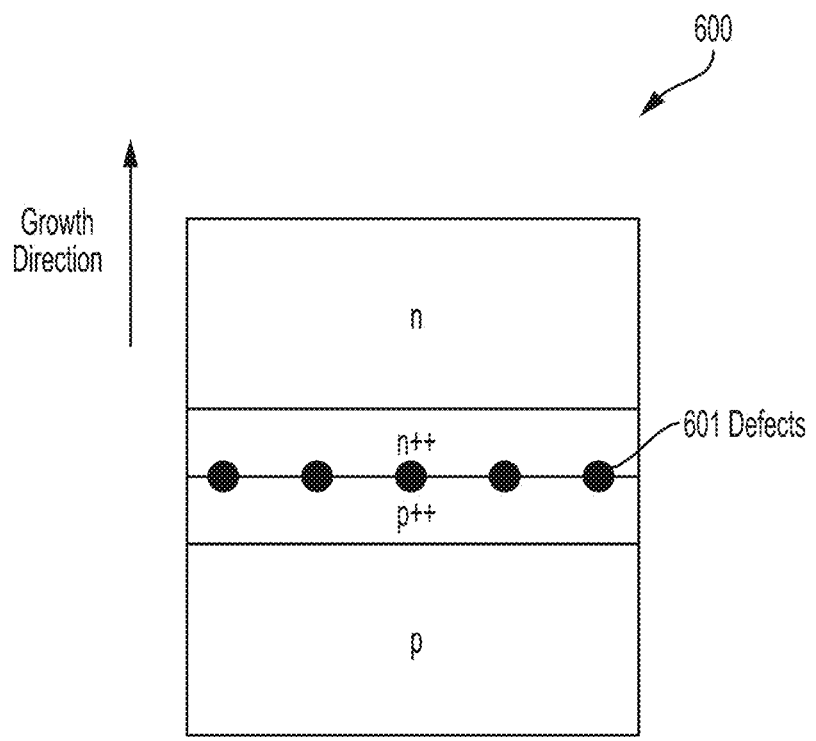

As shown on FIGS. 5 and 6, an interfacial material may be present at the TJ interface 500, for instance as an interlayer, a fractional layer, an impurity, or at trace level. FIG. 5 shows the example or an interlayer 501 at the TJ interface 500, and FIG. 6 shows the example of impurities/defects 601 at the TJ interface 600.

This interfacial material may be introduced during an MOCVD step, a sputtering step, or another step in-between MOCVD and sputtering (including a processing/cleaning/surface preparation step). The material may be a material which promotes tunneling—for instance due to its band gap, due to its effect on interface polarization fields, by creation of a mid-gap state, or more generally due to its impact on the electronic band structure at the TJ interface. The material may form an interlayer which n-doped, p-doped or not intentionally doped. It may comprise an AlGaN layer, an InGaN layer, an AlInN layer, an AlInGaN layer. It may comprise a semimetal, including Gd or Er; this may include full layers (such as a continuous layer of GdN), partial layers (such as quantum dots of GdN in a GaN matrix) or low density of Gd in a GaN matrix.

The interlayer may be thin enough to result in a good (low-resistance) tunnel junction. It may have a thickness less than 10 nm or 5 nm or 3 nm or 2 nm or 1 nm.

The p- and n-doped materials may be AlGaN with an Al composition of less than 5% (or less than 1%) and a free carrier concentration of at least 1E18, 5E18, 1E19, 5E19, 1E20, 5E20.

The p- and n-doped materials may be InGaN with an In composition of less than 5% (or less than 1%) and a free carrier concentration of at least 1E18, 5E18, 1E19, 5E19, 1E20, 5E20. The material may comprise a defect or an impurity. It may continuously cover the TJ interface, or only a fraction of the interface. In some embodiments, the defect is not an extraneous material but rather an intrinsic crystal defect, such as a vacancy. In one specific embodiment, the material comprises oxygen.

Some embodiments employ polarization doping: the composition of a layer is graded spatially (for instance, a layer is an AlGaN layer with a varying composition). The composition grade induces a gradient in band structure (due to the variation in polarization charge with material content) which causes doping. Tis polarization doping can replace or supplement traditional doping based on incorporation of donors and acceptors. In some embodiments, a polarization doping creates a free charge density higher than 1E15 cm−3, 1E16 cm−3, 1E17 cm−3, 1E18 cm−3, 1E18 cm−3.

Some embodiments comprise a sputtered layer grown at a low temperature. This may be advantageous in embodiments where the structure comprises a temperature-sensitive layer, such as an InGaN or AlInGaN layer having a high indium concentration and/or high thickness (for instance, In higher than 20% or 25% or 30% or 35% or 40% or 45% or 50%; and/or thickness above 3 nm or 5 nm or 10 nm or 20 nm or 50 nm or 100 nm). In some embodiments, the temperature-sensitive layer is a high-indium-content quantum well with a peak emission longer than 500 nm. Such layers may be useful, for instance, as long-wavelength light-emitting layers (emitting in the cyan, green, yellow, amber, orange, red or infrared regime) or as optical high-index layers for optical mode confinement. Such layers are often grown at a low temperature (sometimes less than 800 C or 750 C or 700 C or 650 C or 600 C) to promote In incorporation and ensure the material doesn't decompose during growth. In such embodiments, it may be desirable to avoid growing subsequent layers at high temperature to avoid material decomposition. However, MOCVD p-GaN is conventionally grown at a high temperature (sometimes higher than 900 C or 1000 C or 1100 C).

Accordingly, embodiments of the invention provide sputtered layers grown at a temperature below 900 C or 850 C or 800 C, Some embodiments comprise an InGaN-containing layer grown by MOCVD at a first temperature, and a doped sputtered layer subsequently grown at a second temperature, wherein the second temperature is no higher than the first temperature (or the first temperature plus 50 C, 100 C, 150 C, 200 C). In some embodiments, the sputtered layers are grown without causing a substantial degradation of the InGaN-comprising layer (as characterized by XRD, luminescence, spectroscopy, AFM, TEM, 3D atom probe).

In some embodiments, the InGaN-comprising layer is a light-emitting layer, and after the sputtering growth it retains a peak internal quantum efficiency at room temperature higher than 10% (or 5%, 20%, 30%, 40%, 50%, 75%). The peak IQ E may be measured by low-temperature luminescence, by EQE measurement of an LED of known light extraction efficiency, and other techniques known in the art.

In an embodiment, an InGaN-containing layer is grown by MOCVD and covered by a cap (such as a GaN cap) grown by MOCVD which may be undoped or doped. The epi stack is then regrown by sputtering to grow doped material. The growth temperature for the sputtered layers is no higher than the growth temperature of the InGaN-containing layer. The InGaN-containing layer is a light-emitting layer with a peak IQE at room temperature higher than 50%.

Although this Application generally focuses on structures comprising tunnel junctions, some embodiments do not comprise a tunnel junction but benefit from a hybrid MOCVD/sputtered epitaxy thanks to the low growth temperature described above.

Device Structures

TJs can be advantageous to circumvent some device limitations commonly found with p-contacts. For instance, p-GaN has very high sheet resistance so that current spreading is limited. Additionally, making contacts to p-GaN with both good electrical and optical properties can be difficult. A GaN TJ can improve upon these limitations: by regrowing an n-layer above the p-layer, current spreading can be improved and different contact schemes, with lower contact resistances, are available.

Some embodiments of the invention comprise a device (such as an LED or a laser diode) grown by MOCVD, followed by a TJ formed by a combination of MOCVD and sputtering. The TJ ends with n-type material (either n or highly doped n++). A "top" contact is formed on at least a fraction of the top n-material.

Figure 7:
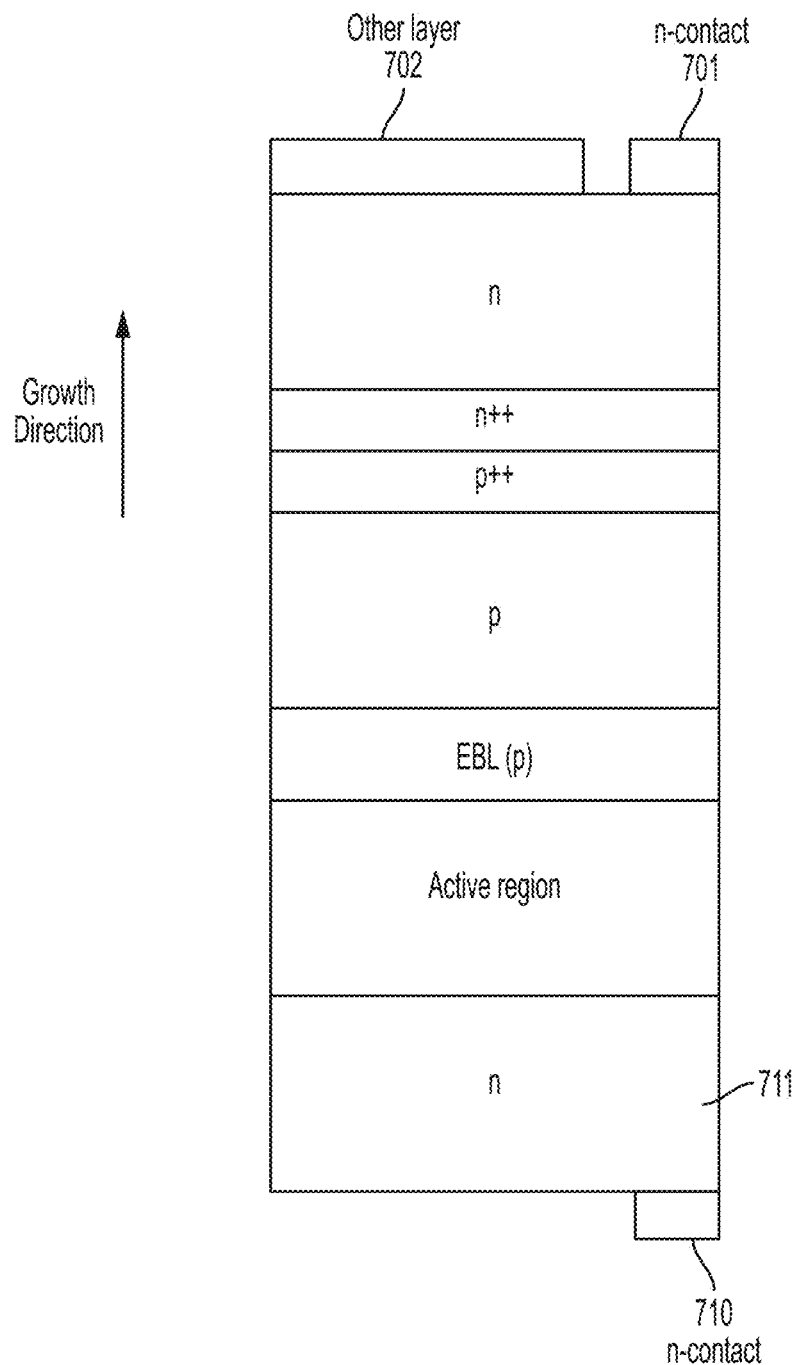

FIG. 7 shows such a device 700. The n-contact layer 701 may be a metallic layer (comprising Au, Ag, Al, Ti, Ni, Pd, and other known metals) or a semi-transparent contact (such as ITO, ZnO, and others). If the n-contact does not cover all the surface of the device 700, the rest of the surface may optionally be covered by another material 702 (such as an optical reflector, which may be a metallic mirror, a dichroic stack or a combination of the two). In the embodiment where the reflector is a combination of a dichroic stack and a metal, care may be taken to maximize the reflectivity of the stack not only at normal incidence but at all angles and all polarizations; this is not trivial for light coming from III-Nitride material with a high index (about 2.5), which may leak through a dichroic stack (especially at large angle and in TM polarization). In some embodiments the stack is optimized (for instance, numerically) such that reflectivity is maximized when integrated over an angular distribution of light at all angles and/or a wavelength range.

Further, the device of FIG. 7 comprises a "bottom" n-contact 710 made to the n material 711 at the bottom of the stack (the device may be in a vertical or flip-chip configuration). Alternatively a contact may be made to a conductive substrate rather than epitaxial material (for instance, to a bulk n-GaN substrate rather than MOCVD GaN).

TJs can also be advantageous to mitigate the decrease of internal quantum efficiency at high current, known as efficiency droop. It is known that droop scales with carrier density in the active region, but simply adding many quantum wells in an active region can be an insufficient solution because carriers may not spread uniformly along many wells. By using TJs, it is possible to stack more than one active region (see Garcia99]); since the several active regions are separated by TJs, carrier spreading occurs separately in each TJ, which reduces droop.

In such embodiments, it can be important to ensure that the sputtered material is coherent with the MOCVD material (as described elsewhere in this application), so that the quality of the subsequent active regions is maintained.

Figure 8:
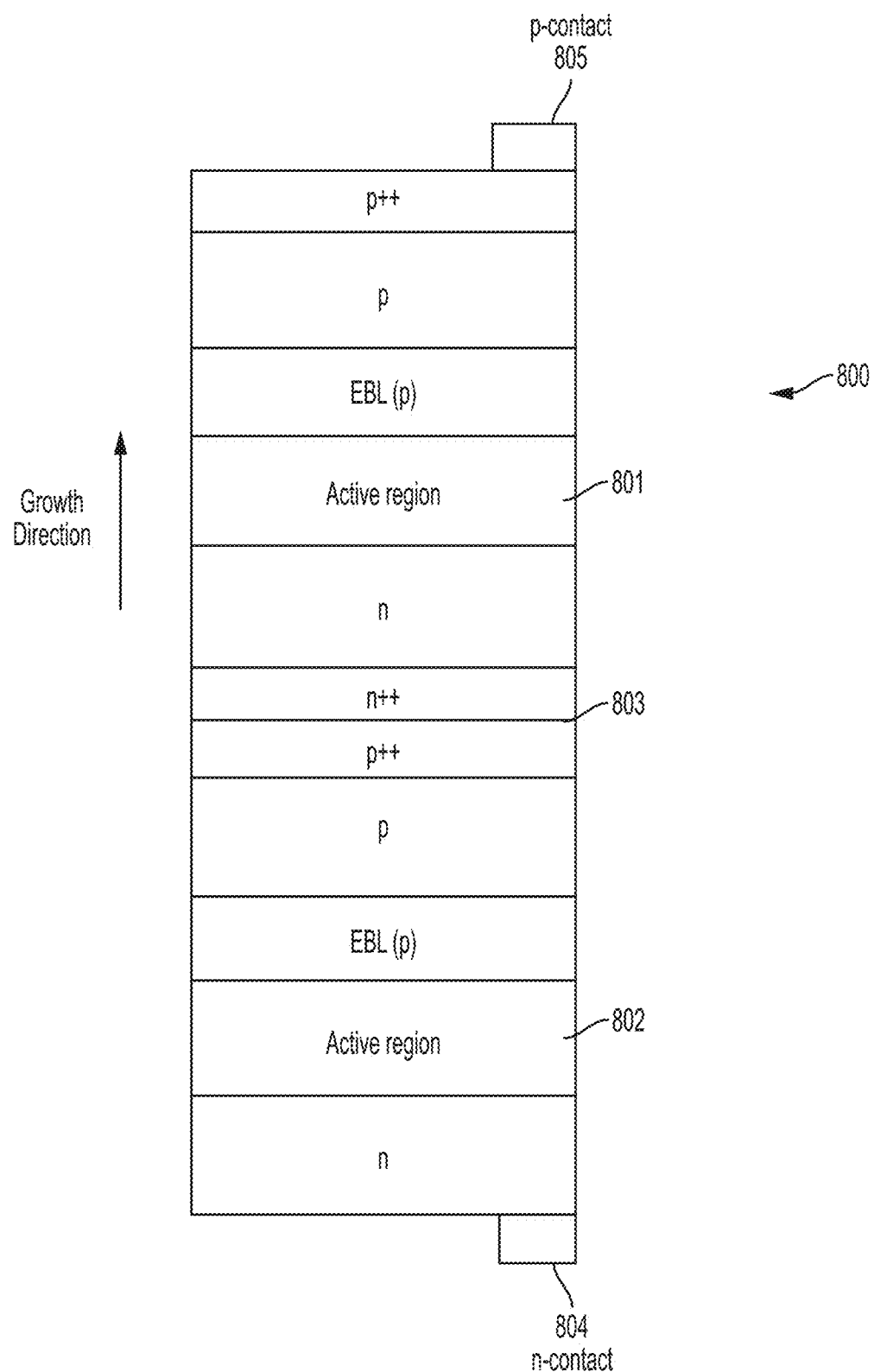

FIG. 8 shows such a structure 800, comprising two active regions 801, 802 and a TJ 803 in-between. The active regions are both grown by MOCVD, and the TJ by a combination of MOCVD and sputtering. The two active regions are in series, with metallic contacts 804, 805 at both sides for current injection. The bottom contact 804 may be made to a conductive substrate or to MOCVD GaN. Further, the device of FIG. 8 may be capped with yet another TJ, or a succession of TJs and active regions, e.g., three active regions, or ten, or more TJs and active regions.

In some embodiments, only the first active region is grown by MOCVD, while the TJ and the second active region are grown by sputtering. This may be desirable in embodiments where MOCVD cannot grow an active region with good quality—for instance, at very high In contents (such as more than 20% In, 30% In, 40% In, 50% In) where sputtering growth may be preferable, and may prevent relaxation.

Figure 9:
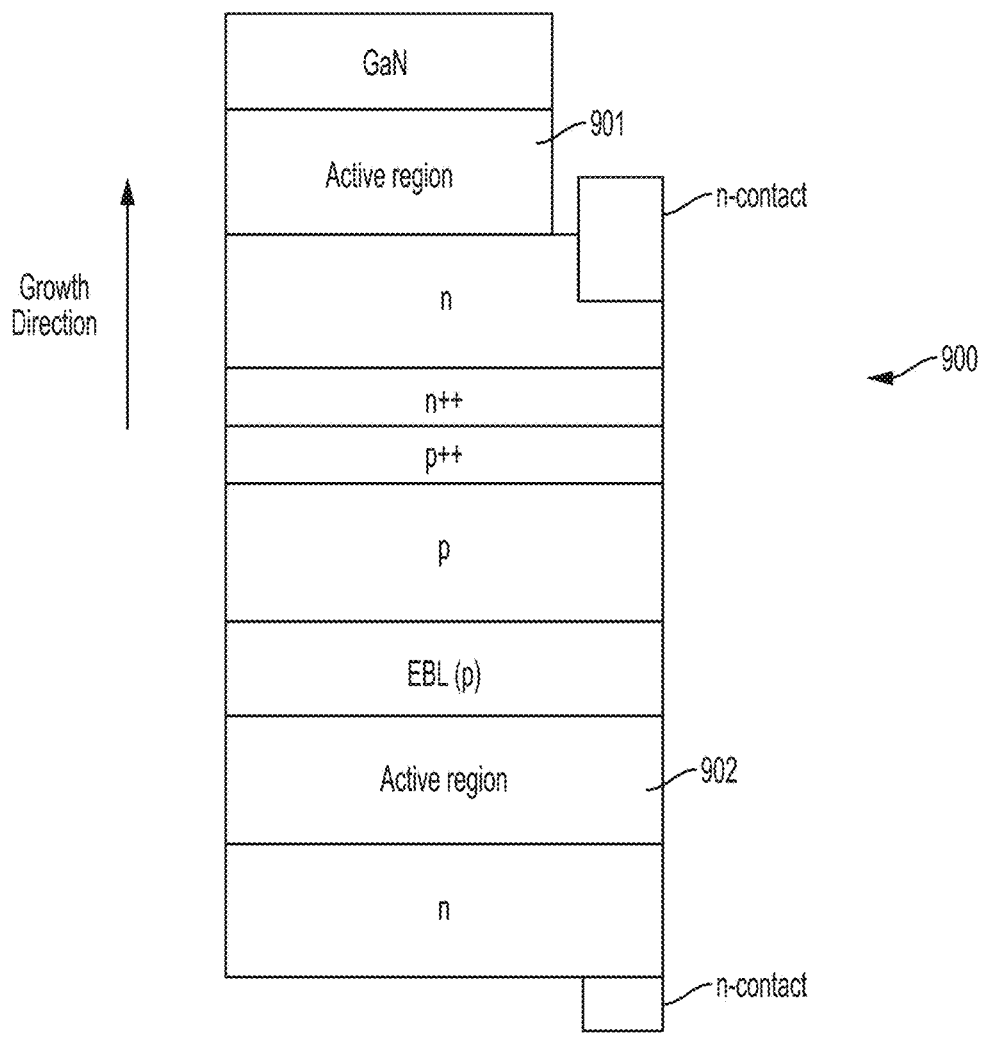

FIG. 9 shows an alternative embodiment of a device 900 where a second active region 901 is grown (either by MOCVD or sputtering), but is not injected electrically. Rather, the electrical junction is across the first active region 902 grown by MOCVD. The second active region 901 is optically pumped by the first active region upon electrical operation. In some embodiments, the second active region emits at a longer wavelength than the first region. For instance, the first active region may emit violet or blue light, and the second active region may emit green or yellow light. This may be advantageous because it is possible to obtain III-Nitride active layers with good internal quantum efficiency at long wavelength, but poor carrier spreading may make droop problematic at such wavelengths. By optically pumping such active regions, the difficulty of carrier spreading is circumvented.

Figure 10:
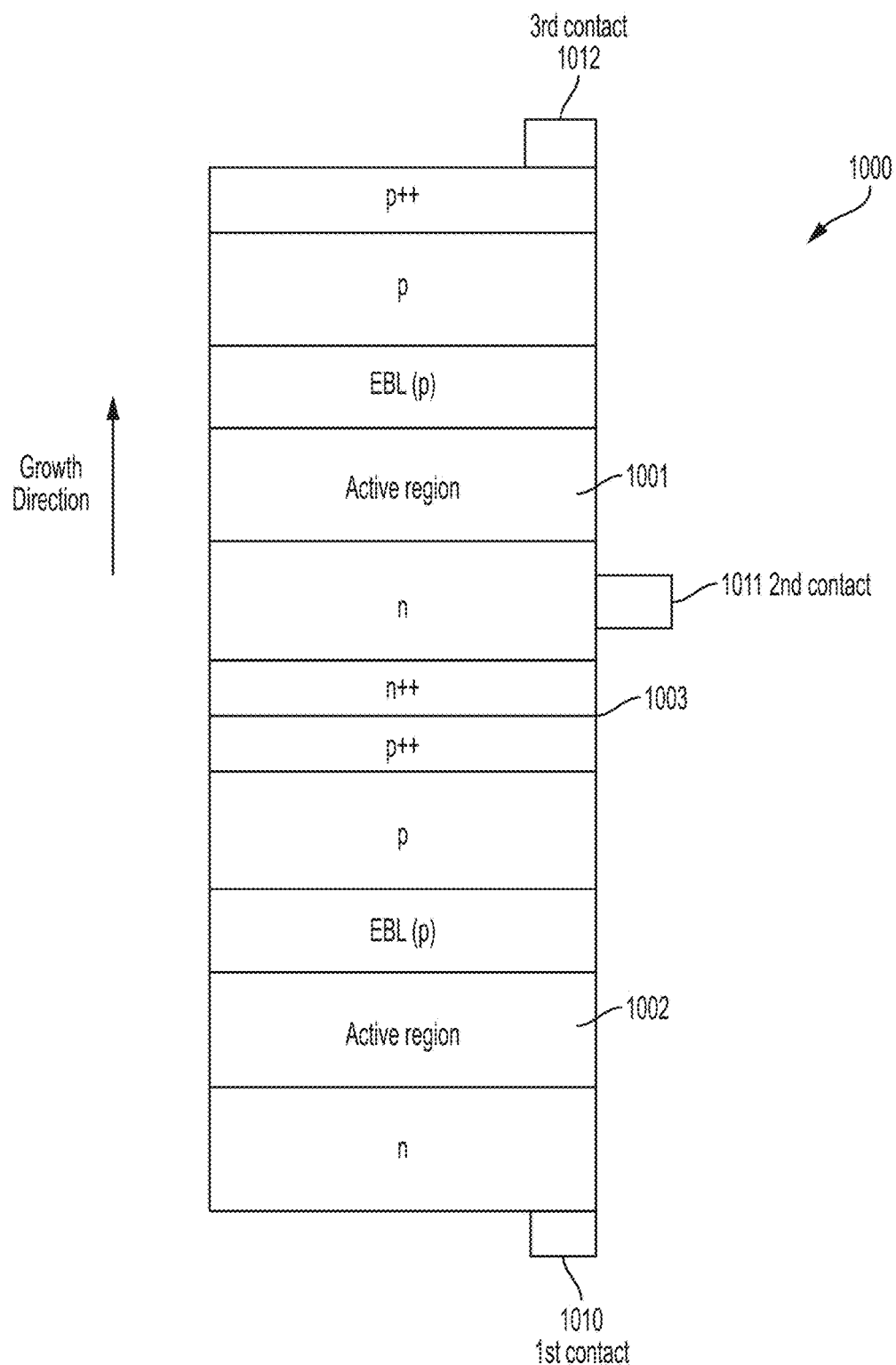

As shown on FIG. 10, in other embodiments of the device 1000, several active regions 1001, 1002 are present, with TJs 1003 in-between. In this embodiment, more than two electrical contacts 1010, 1011, 1012 are formed. For instance on FIG. 10, three contacts are formed such that two active regions 1001, 1002 can be independently driven. In some embodiments the active regions have different emission wavelengths, such that color tuning of the light source can be achieved. The contacts can be formed by etching mesas in the material, as is known in the art, or as lateral contacts as shown on FIG. 10.

Although the device structures shown here possess active regions (which can be understood as light-emitting regions), the invention also pertains to electronic devices which do not comprise an active region.

In some light-emitting embodiments, the doping level in the various doped layers is configured such that light emission is uniform (within +/−10% optical intensity of +/−20% optical intensity) across the active region of the device (which may have an area of 100×100 um, 250×250 um or 1×1 mm) at a current density of 10A·cm−2 or 50A·cm−2 or 100A·cm−2 or 500A·cm−2 or 1000A·cm−2.

The active regions may comprise active layers, including one or several quantum wells and/or one or several double heterostructures. The active layers may comprise InGaN or AlInGaN. The In content may be in the range 1%-50%, 3%-40%, 5%-30%, 8%-20%. The In content may be substantially 8%, 9%, 10%, 11%, 12%, 13%, 14%, 15%, 18%, 20%, 25%, 30%, 33%, 40%, 50%. The active layer may be pure InN. The active layers may emit ultra-violet light, violet light (for instance in the range 380 nm-440 nm or 400 nm-430 nm), blue light (for instance in the range 440-490 nm), green light, yellow light, red light.

Some embodiments comprise at least one active region grown by MOCVD. It is possible to obtain active regions with very high efficiency from MOCVD growth. For instance, see [Hurni15]. By combining this performance with Tjs grown by sputtering, embodiments provide high-efficiency optoelectronic devices comprising one or several active region grown by MOCVD, each active region featuring one or several of the following, measured at room temperature:

Peak IQE above 70%, above 80%, above 90%, above 95%

Peak IQE in the range 70%-95%, in the range 80%-95%

Peak WPE above 70%, above 80%, above 85%

Peak WPE in the range 70%-80%, 70%-90%

IQE at a current density 100A·cm−2 above 70%, above 80%, above 90%

IQE at a current density 100A·cm−2 in a range 70%-90%

WPE at a current density 100A·cm−2 above 60%, above 70%, above 80%

WPE at a current density 100A·cm−2 in a range 70%-80%

As explained above, multiple active regions with respective p-n junctions can be stacked. Thus the EQE and WPE may be pushed to a higher power density. For instance, if each junction has a voltage Vf (say 3V), two junctions can be stacked for a total voltage of about 2×Vf (plus, potentially, a voltage caused by the small series resistance of the TJ).

In some embodiments, the series resistance of the TJ is configured to be below 10 Ohm, below 5 Ohm, below 2 Ohm, below 1 Ohm, below 0.5 Ohm, below 0.2 Ohm, below 0.1 Ohm, below 0.01 Ohm. This may be achieved by increasing the doping levels of the TJ layers, and by promoting tunneling with interlayers and impurities as discussed above.

In some embodiments, the TJ is characterized by a low specific contact resistance. For instance, the specific contact resistance is less than 1E-2 (or less than 5E-3, 1E-3, 5E-4, 1E-4, 1E-5, 1E-6) Ohm·cm2 at a current density of 100A·cm−2 (or 1A·cm−2, 10A·cm−2, 1000A·cm−2).

In some embodiments, the voltage drop across the TJ is less than 0.5V (or 1V, 0.1V, 0.05V, 0.01V) at a current density of 100A·cm−2 (or 1A·cm−2, 10A·cm−2, 50A·cm−2, 1000A·cm−2).

In some embodiments, thanks to the negligible extra resistance of the TJ, the total WPE of the device is substantially equal to the WPE of each electrically-driven active region (at the same current density), with the same ranges as described above.

Sputtering Source Materials

In some embodiments, the sputtering source material comprises one or several group III metals such as Ga/In/Al. In certain embodiments, the sputtering source material further comprises N. For instance, the source material may be GaN. In such embodiments, sputtering may be performed in an inert environment such as Argon, or be performed in a nitrogen-containing ambient. In other embodiments, the source material is a group-III metal; sputtering is performed in a nitrogen-containing environment, such that the N and group-III metals react at the surface of the sample to form a sputtered layer.

The group III metal source for the sputtered group III metal nitride film may comprise at least one of gallium metal, aluminum metal, indium metal, gallium nitride (GaN), aluminum nitride, indium nitride, gallium oxide (Ga2O3), gallium fluoride (GaF3), gallium chloride (GaCl3), gallium bromide, and gallium iodide (GaI3), aluminum oxide, aluminum fluoride, aluminum chloride, indium oxide, indium fluoride, and a complex of one or more of these with ammonia (NH3).

The group III metal source may further comprise an element or material that may serve as a dopant in GaN. In the embodiment of an n-type dopant, this includes Si, Ge, C, Sn and O. The doping element may be incorporated to the group III metal source, for instance by melting it in or in-diffusing it. It may be present in dilute form. In some embodiments, the composition of the sputtered material matches the composition of the sputtering target. Therefore, the composition of the sputtering target may be selected to achieve a desired doping level. For instance, the target may contain a dopant (Si, Ge, Mg or other) at a concentration 1E18 cm−3, 2E18 cm−3, 5E18 cm−3, 1E19 cm−3, 2E19 cm−3, 5E19 cm−3, 1E20 cm−3, 2E20 cm−3, 5E20 cm−3, 1E21 cm−3, 2E21 cm−3, 5E21 cm−3, or a concentration within a range 1E19 cm−3 to 1E21 cm−3 or 1E18 cm−3 to 5E21 cm−3. In some embodiments several sputtering targets are present in the sputtering system, with varying doping levels.

Doping elements (including C, Si, Ge, Sn) may also be introduced in the gas ambient during sputtering, and incorporated in the sputtered material.

The group III metal source may be liquid or solid. In certain embodiments, including embodiments where the group III metal source is liquid, the group III metal source is upward-facing and positioned opposite one or more downward-facing substrates. In the embodiment of a liquid source, the source may be stirred or agitated by ultrasonic energy to avoid poisoning of the surface. In alternative embodiments, the group III metal source is downward-facing and positioned opposite one or more upward-facing substrates. In certain embodiments, the group metal source comprises single-crystal GaN, for example, a bulk GaN wafer or a thick GaN-on-sapphire template. In certain embodiments, the group III metal source comprises polycrystalline GaN or polycrystalline AlN. in certain embodiments, the polycrystalline GaN has equiaxed grains. In certain embodiments, the polycrystalline GaN has been formed by sintering GaN powder, as described in U.S. Pat. No. 6,861,130. In certain embodiments, the GaN powder for sintering has been formed by an ammonothermal process. In certain embodiments, the polycrystalline GaN has a columnar microstructure, as described in U.S. Pat. No. 8,039,412.

Doping may further be achieved by co-sputtering of a doping element at the same time as the source material. For instance, there may be co-sputtering of a Ga target and of a Si (or Ge) target.

Process Details

The following details pertain to the sputtering growth step. The sputtering step may occur in a dedicated sputtering tool, or in a tool having both MOCVD and sputtering capabilities. In some embodiments, the sputtering growth occurs right after the MOCVD growth. In other embodiments, additional steps may occur in-between. For instance, the MOCVD material may be annealed in a variety of environments (including an activation step for p-layers grown by MOCVD), or the surface of the MOCVD-grown epi may be subjected to a chemical treatment (including in a gas phase, or in a liquid phase). Such treatments may prepare the MOCVD surface for regrowth by sputtering.

A possible sputtering sequence is outlined below.
- The deposition proceeds by RF-sputtering
- The target material is a metallic Ga target, with a diameter of 10 cm, facing upward in the deposition chamber, placed on a water-cooled electrode to control target temperature
- The chamber is evacuated to a pressure of 1E-4 Pa
- Ar is introduced in the chamber, with a pressure controlled by a mass flow controller
- The Ga target undergoes a surface treatment prior to deposition to prepare it: it is subjected to an RF power of 100 W at a pressure of 1 Pa in Ar ambient, for 30 min
- A mixture of Ar and N2 is introduced in the chamber, with an Ar flow of 8 sccm and a N2 flow of 2 sccm.
- A sample is placed on a rotating planetary stage. It is heated to a temperature of 300 C. The pressure is adjusted to 1 Pa, the RF power to 500 W. Sputtering deposition of GaN occurs at a rate of 1 um/hr.

Further process variations are discussed hereafter.

The flow and partial pressure of N2 can be modulated to achieve stoichiometric deposition of the desired III-Nitride material with high crystalline quality. In particular, increasing the N2 pressure can increase the rate of reaction of Ga with N2.

The total gas flow and pressure, the total RF power and the sample temperature can be modulated to promote epitaxial growth. Increasing the RF power can increase the kinetic energy of atoms, therefore providing enough energy for crystal formation, and increasing their mobility to promote epitaxial growth (i.e. increasing the atomic mobility and kinetic energy at the growth surface enables atoms to register with the underlying crystal lattice). At the same time, higher RF power promotes sputtering and can increase growth rate. Therefore, an optimal power may be selected which promotes epitaxial growth while achieving a desired growth rate. Increasing the total pressure can, at first, increase crystal quality by providing more ionized gas atoms and hence more kinetic energy; at higher pressure, collisions by gas species can reduce the available energy. Therefore, an optimal pressure may be selected which maximizes crystal quality and epitaxial growth.

The frequency and duty cycle of the pulsed sputtering can be selected to promote crystal quality and epitaxial growth. In some embodiments, the pulsed sputtering is configured for a limited supply of group-III metal to the surface, leading to enhanced surface migration.

In some embodiments, the sputtering step includes an initial step which prepares the surface of the MOCVD material—such as an etch-back step which may be caused by a plasma.

In some embodiments the group-III metal sputtering source is maintained at a temperature below about 25 degrees Celsius, so as to maintain the metal as a solid (for instance, in the embodiment of metallic gallium). In some embodiments, under deposition conditions the temperature of the group III metal source is between about 25 degrees Celsius and about 200 degrees Celsius, or between about 30 degrees Celsius and about 100 degrees Celsius.

The temperature of the substrate during deposition may be between room temperature and about 1000 degrees Celsius, between about 100 degrees Celsius and about 800 degrees Celsius, between about 200 degrees Celsius and about 700 degrees Celsius, between about 300 degrees Celsius and about 600 degrees Celsius, or between about 400 degrees Celsius and about 500 degrees Celsius.

A group III metal nitride film may be deposited on the substrate by sputtering, including radio-frequency (RF)-magnetron sputtering or pulsed sputter or DC sputter deposition. The atmosphere may contain one or more of Ar, N2, and NH3. The RF power may be between about 100 W and about 10,000 W, or between about 200 W and about 2,000 W. The ambient pressure may be between about 0.1 and about 20 Pa, or between about 0.3 and about 5 Pa.

The sputtering may be configured to comprise a plasma with high kinetic energy, which can promote surface mobility and promote crystalline growth and epitaxial. The voltage applied to the sample and the pressure of the process may further be configured to promote crystalline growth and epitaxial growth.

The III-Nitride film may be annealed after sputtering deposition, for example, to a temperature above about 600 degrees Celsius, above about 700 degrees Celsius, above about 800 degrees Celsius, above about 900 degrees Celsius, or above about 1000 degrees Celsius, for a time above about 10 seconds, about 1 minute, about 3 minutes, about 10 minutes, about 30 minutes, or about one hour, in an atmosphere comprising one or more of air, O2, H2, Ar, He, N2, or NH3.

The III-Nitride film may be processed after sputtering deposition, including polishing and other finishing steps to recover an epi-ready morphology which is suitable for MOCVD regrowth, in embodiment a second MOCVD layer is desired.

In some embodiments, the sputtering environment has low hydrogen content. This prevents p-GaN passivation, such that the sputtered p-layers are activated as-grown.

In some embodiments, the sputtering environment has low carbon content. This prevents the incorporation of carbon, which can act as a passivating defect.

In some embodiments, the growth temperature (i.e. the temperature of the sample on which material is deposited) is low, providing advantages. For instance, some materials are easy to grow at very low temperature (including InGaN with very high In content, such as 20%, 30%, 40%, 50% and above, or pure InN). The strain limitations typically found at high growth temperature may not be an issue at lower temperature—thus allowing much thicker layers with more strain without relaxation, compared to conventional MOCVD growth. In some embodiments, the sputtering sample temperature is selected to deposit a III-Nitride layer which does not relax strain, whereas such a layer would have relaxed in conventional MOCVD growth.

Since sputtering may happen far from thermodynamic equilibrium, the epitaxial defects found in MOCVD may be avoided. Conversely, other, desirable defects may be incorporated—this includes defects at the TJ interface which may lower the tunneling barrier. In some embodiments, the sputtering growth proceeds in the presence of a liquid Ga metal layer (or Ga droplets) at the sample's surface.

In some embodiments, the sample temperature is selected to avoid Mg diffusion at the initial stages of sputtering growth. For instance, in an embodiment where p or p++ GaN was grown by MOCVD, it is desirable to avoid forward-diffusion of Mg into the n or n++ layers which are being grown by sputtering.

Figure 11:
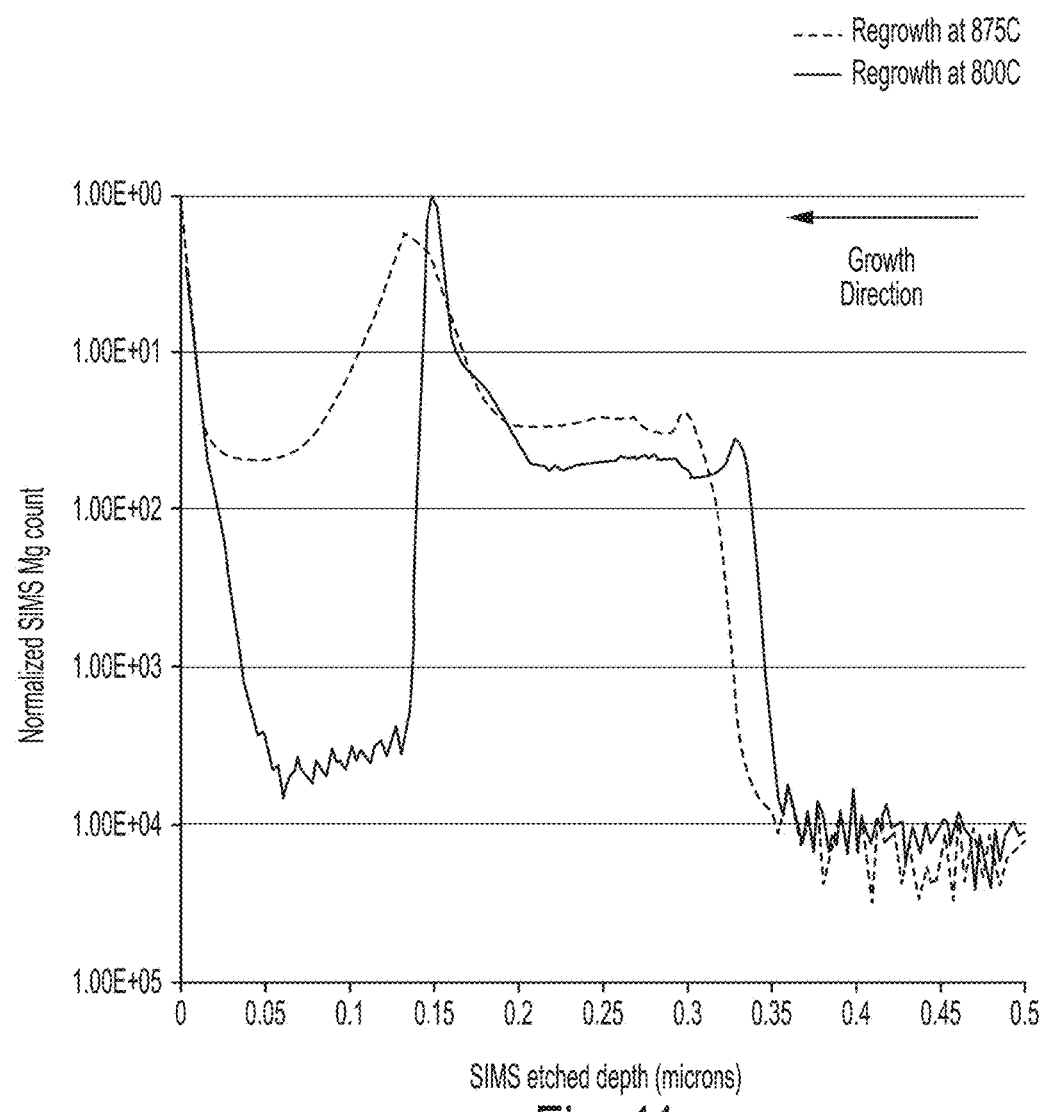
FIG. 11 demonstrates Mg diffusion in MOCVD as revealed by experimental SIMS profiles.

FIG. 11 demonstrates Mg diffusion in MOCVD as revealed by experimental SIMS profiles. The epi structure comprises n-doped layers, p-doped layers and n-doped layers, all grown by MOCVD. The last n-layer is grown during a regrowth step. Two growth temperatures are investigated. At 800 C, forward-diffusion of the Mg in the n-GaN is minimal (with a decrease in Mg concentration of more than three orders of magnitude across a distance of about 10 nm). At 875 C, forward-diffusion is substantial (with a decrease in Mg concentration of on order of magnitude across a distance of about 50 nm).

Accordingly, to avoid Mg diffusion, the initial n-doped sputtered layer may be grown at a temperature below 800 C, below 700 C, below 600 C, below 500 C, below 400 C, below 300 C, below 200 C, or at room temperature. Once the p-doped GaN is capped with n-GaN, further diffusion is hindered; therefore, subsequent layers may be grown at a higher temperature than the initial layer if desired.

In some embodiments, the sample temperature is however high enough to ensure a high surface mobility and ensure epitaxial growth. Accordingly, to avoid Mg diffusion, the initial n-doped sputtered layer may be grown at a temperature above 1000 C, above 900 C, above 800 C, above 700 C, above 600 C, above 500 C, above 400 C, above 300 C.

In some embodiments, the sputtering occurs at moderate temperature or room temperature to prevent the formation of crystal defects which may be thermally activated. The epitaxial growth is instead promoted by other processing factors, such as an increase in the RF power and gas pressure, or selection of the pulsed supply of group-III metal.

In some embodiments, the sputtering chamber is a ultra-high vacuum chamber. This avoids the presence of unwanted contaminants. For instance, the pressure (before intentional gas flow) may be below 1E-6 Torr, 1E-7 Torr, 1E-8 Torr, 1E-9 Torr, 1E-10 Torr.

In various embodiments, defects are present at the regrowth interface to improve tunneling at the TJ interface, as shown on FIG. 6. These detects may be chemical species (such as oxygen, carbon, silicon, germanium) or physical crystal defects (such as vacancies) or macroscopic detects (such as surface roughness or imperfect crystal interfaces with dangling bonds). The presence of these defects may be promoted by a processing step (such as a step between the two growth steps, as shown on FIG. 3) or by the parameters of the sputtering growth and MOCVD growth. For instance, in some embodiments, the p-type layer is annealed in a slightly oxygen-containing environment to form a delta-O-doped layer at the p+-n+ interface and decrease the barrier height of the tunnel junction. Other annealings (or surface preparation steps, including exposure to a liquid) are possible, to introduce other suitable chemical species at the interface. The defects may also be occurring unintentionally during the handling of the water (i.e. natural wafer surface contamination with air during the sample transfer from MOCVD to sputtering). The defect density may be on the order of 1E8 cm-2, 1E9 cm-2, 1E10 cm-2, 1E11 cm-2, 1E12 cm-2.

In some embodiments, the stoichiometry of the sputtering growth conditions is selected. In some embodiments, it may be rich in column-III elements (such as Ga) or rich in N or substantially stoichiometric between N and the group-III elements. This may be selected to maximize the doping concentration or the material surface morphology. In some embodiments, highly N-rich conditions are used to prevent the formation of Ga droplets and therefore promote two-dimensional growth. In some embodiments, the stoichiometry is switched between N-rich and III-metal rich to mitigate various aspects of crystal quality.

Figure 12:
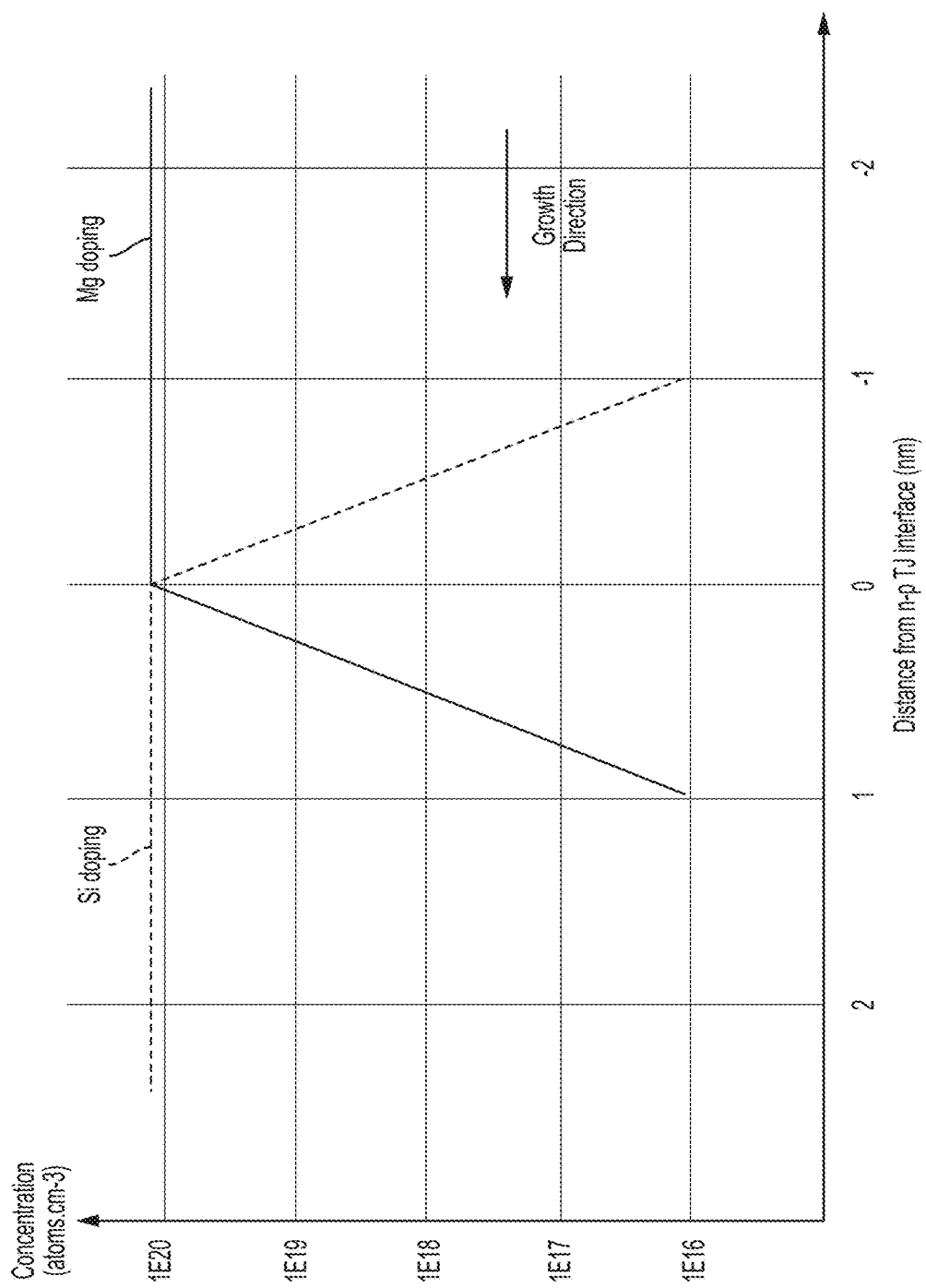
FIG. 12 illustrates a doping profile according to an embodiment.

FIG. 12 illustrates a doping profile according to an embodiment. In this example, the n- and p- dopants are Si and Mg, although other species can be considered. The TJ interface may correspond to the regrowth interface between MOCVD and sputtering. In its majority region, the concentration of each species is about 1E20. The concentration of each species decreases by four orders of magnitudes within 1 nm of the interface in the minority region. This corresponds to a sharp junction.

Figure 13:
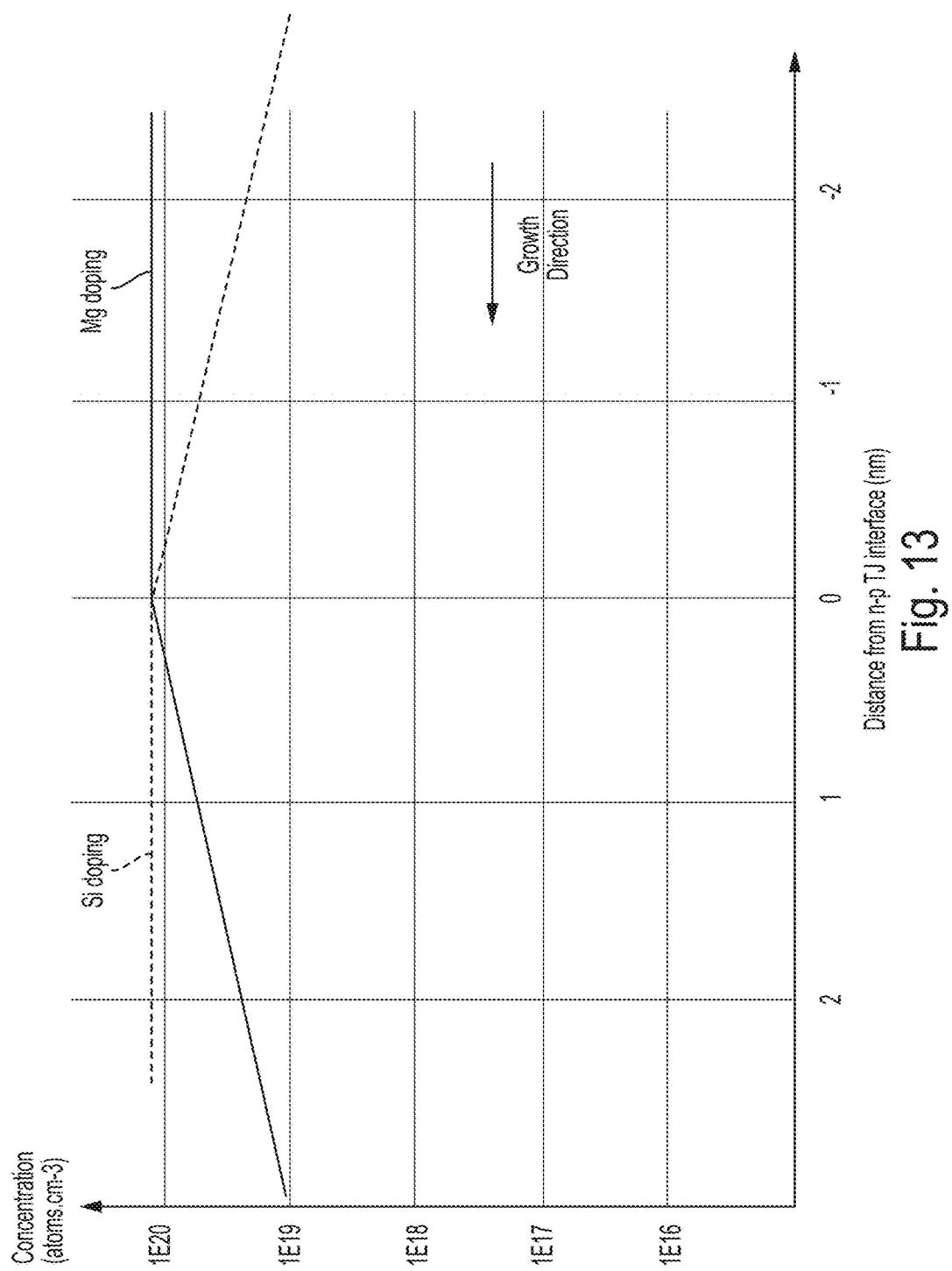
FIG. 13 illustrates another, less-sharp, doping profile.
Figure 14:
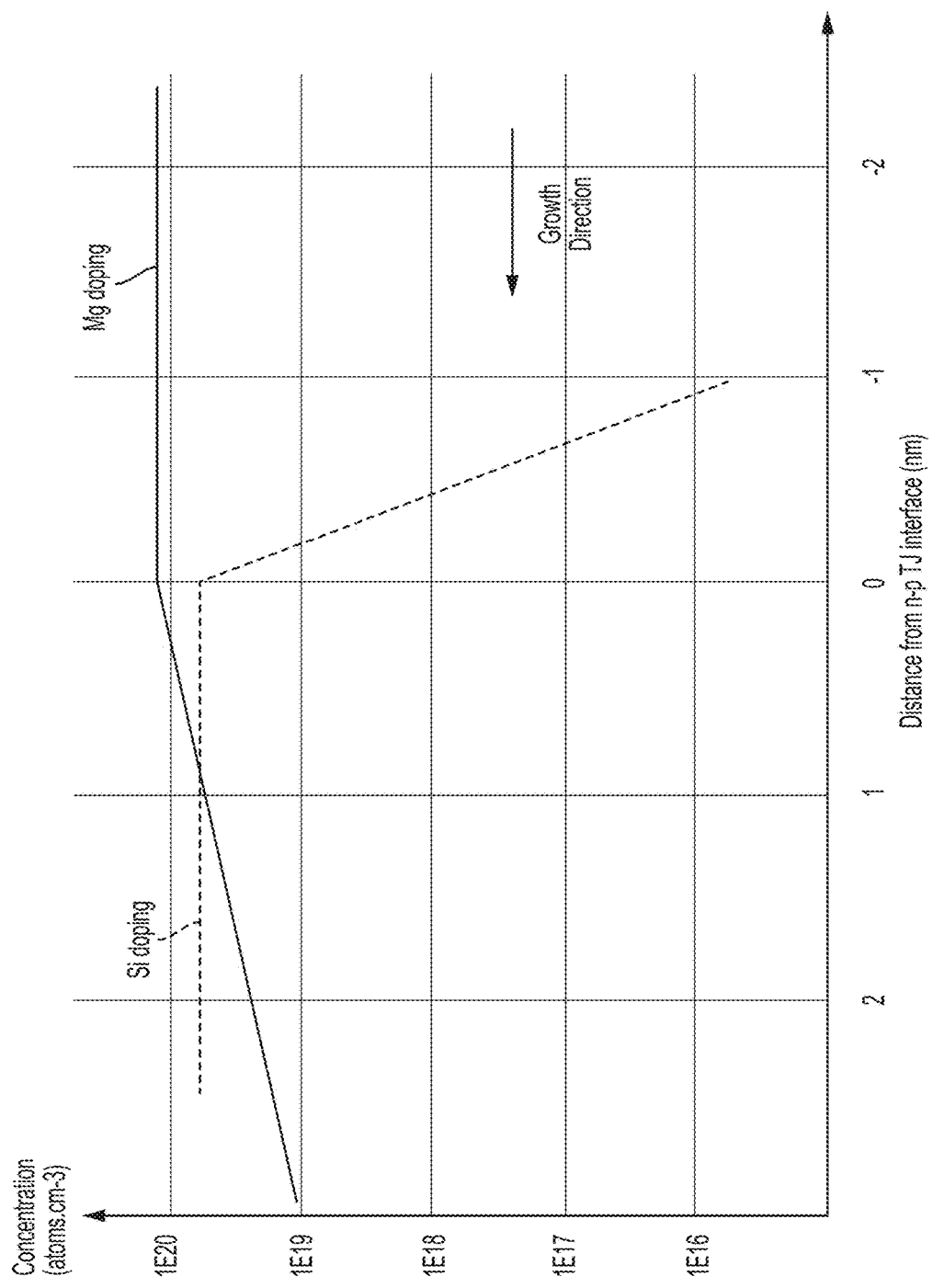
FIG. 14 illustrates another, doping profile. In this embodiment, the Si profile is very sharp and the Mg profile is less sharp

FIG. 13 illustrates another, less-sharp, doping profile. In this embodiment, each species decreases by one order of magnitude over 3 nm form the interface. FIG. 14 illustrates another, doping profile. In this embodiment, the Si profile is very sharp and the Mg profile is less sharp. In various embodiments, a dopant species may decrease from the TJ interface by one, two, three, four, or five orders of magnitude, over a distance of 1 nm, 2 nm, 3 nm, 5 nm, 10 nm. In some embodiments, other species contribute to the n-doping (for instance, oxygen, germanium . . . ).

In some embodiments, the fraction of Mg atoms which are activated is at least 1%, at least 5%, at least 10%, at least 20%, at least 50%, at least 80%. This may be obtained by growth in a H-free environment, by an activation step, or by a combination of the two.

In some embodiments, the sputtered film is subsequently annealed at a high temperature to improve its crystalline quality (for instance, to reduce its XRD rocking curve FWHM). This process may occur at about 800 C, 900 C, 1000 C, 1100 C, 1200 C, or 1300 C for a time of 1 min, 5 min, 10 min, 30 min, or 1 hr.

Exemplary Embodiment

In an exemplary embodiment, a device is obtained by the following steps:

An n-doped bulk GaN substrate is provided with a TDD of about 1e6 cm−2.

The substrate is inserted in an MOCVD reactor, and MOCVD layers are grown including: a Si-doped n-layer, a light-emitting active region, an EBL, a Mg-doped p-layer with a doping density of 5E18 cm−3, a Mg-doped p++ layer with a doping density of 2e20 cm−3 and a thickness of 5 nm.

The p-layers of the sample are activated in an annealing furnace

The sample undergoes a processing step to form a selected density of a desired impurity on its surface The sample is inserted in a sputtering deposition chamber, and sputtered layers are grown from a metal Ga source in nitrogen-containing ambient. The layers include a Si-doped n++ layer with a doping density of 2e20 cm−3 and a thickness of 5 nm, and a Si-doped n layer with a doping density of 1E19 cm−3.

The parameters of the sputtering deposition are configured to yield epitaxial growth of the sputtered material on the MOCVD material. The sputtered material is characterized by a TDD which is less than 2E6 cm−2 (or less than twice or ten times the TDD of the MOCVD GaN). The sputtered material is characterized by a coherent crystal grain whose area is at least 10,000 um2. The sputtered material is characterized by an XRD rocking curve FWHM which is less than twice that of the MOCVD GaN.

The sample is inserted in an MOCVD reactor, and a second set of MOCVD layers is grown including: a Si-doped n-layer, a light-emitting active region, an EBL, a Mg-doped p-layer with a doping density of 5E18 cm−3, a Mg-doped p++ layer.

The sample undergoes standard device fabrication steps, including the formation of an n-contact on the GaN substrate and a p-contact on the p++ layer at the top of the epitaxial stack. Upon operation of the device, both active regions are electrically driven.

These and other advantages maybe realized in accordance with the specific embodiments described as well as other variations. It is to be understood that the above description is intended to be illustrative, and not restrictive. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" are used as the plain-English equivalents of the respective terms "comprising" and "wherein." Moreover, in the following claims, the terms "first," "second," and "third," etc. are used merely as labels, and are not intended to impose numerical requirements on their objects.

The invention claimed is:

1. A method of forming a III-Nitride based device comprising:
    depositing first layers by metal-organic chemical vapor deposition (MOCVD) on a substrate, wherein said first layers comprise heavily n-doped layers of III-Nitride material at a doping concentration of at least 2E19·cm−3; and
    depositing epitaxial second layers over said first layers by at least one of sputtering, plasma deposition, pulsed laser deposition, or liquid phase epitaxy, wherein said second layers comprise heavily p-doped III-Nitride material at a doping concentration of at least 2E19·cm−3, wherein said first and second layers form at least partially a tunnel junction such that carriers tunnel from the first layers to the second layers, wherein said tunnel junction has a specific contact resistance lower than 5E-3 Ohm·cm2 at a current density of 100 A·cm−2.

2. The method of claim 1, wherein said first layers have a lower defect concentration than said second layers.

3. The method of claim 2, wherein said first layers have a lower defect concentration than said second layers such that, said first layers have a first average defect concentration, said second layers have a second average defect concentration, and said second average defect concentration is at least twice said first average defect concentration.

4. The device of claim 3, wherein said second average defect concentration is one of: an impurity concentration higher than 1E17 cm−3, or an intrinsic defect concentration higher than 1E16 cm−3.

5. The method of claim 3, wherein at least one layer of the second layer has an extrinsic defect comprising one of the following species: O, C, If, a transition metal, a metal; or an extrinsic defect selected form: a Ga or N vacancy, a Ga or N interstitial.

6. The method of claim 2, wherein the deposition of said second layers is epitaxial such that at least one of the following is true:

wherein said first layers are characterized by a first threading dislocation density (TDD) and said second layers are characterized by a second TDD, wherein said second TDD is no more than twice said first TDD;

wherein said first layers are characterized by a first X-ray diffraction (XRD) rocking curve full width at half maximum (FWHM) and said second layers are characterized by a second XRD rocking curve FWHM, wherein said second FWHM is no more than twice said first FWHM.

7. The method of claim 1, wherein a last layer of said first layers has a lower defect concentration than a first layer of said second layers.

8. The method of claim 1, wherein said tunnel junction is defined either within said second layers or at said interface of said first layers and said second layers.

9. The method of claim 1, wherein said tunnel junction is defined at said interface of said first layers and said second layers.

10. The method of claim 1, wherein said second layers are deposited by sputtering and at least a portion of sputtering occurs in an ambient comprising nitrogen.

11. The method of claim 1, further comprising growing third layers by MOCVD on said second layers.

* * * * *